United States Patent

Winkler et al.

(10) Patent No.: US 9,080,104 B2
(45) Date of Patent: Jul. 14, 2015

(54) MN-ACTIVATED PHOSPHORS

(75) Inventors: Holger Winkler, Darmstadt (DE); Thomas Juestel, Witten (DE); Andre Bleise, Steinfurt (DE)

(73) Assignee: Merck Patent GmbH, Darmstadt (DE)

( * ) Notice: Subject to any disclaimer, the term of this patent is extended or adjusted under 35 U.S.C. 154(b) by 194 days.

(21) Appl. No.: 13/877,954

(22) PCT Filed: Sep. 16, 2011

(86) PCT No.: PCT/EP2011/004652
§ 371 (c)(1),
(2), (4) Date: Apr. 5, 2013

(87) PCT Pub. No.: WO2012/045393
PCT Pub. Date: Apr. 12, 2012

(65) Prior Publication Data
US 2013/0193472 A1 Aug. 1, 2013

(30) Foreign Application Priority Data
Oct. 6, 2010 (DE) .......................... 10 2010 047474

(51) Int. Cl.
C09K 11/77 (2006.01)
H01L 33/50 (2010.01)

(52) U.S. Cl.
CPC ......... C09K 11/7769 (2013.01); C09K 11/7703 (2013.01); C09K 11/7706 (2013.01); C09K 11/7774 (2013.01); H01L 33/502 (2013.01)

(58) Field of Classification Search
USPC ................... 252/301.4 R; 313/503; 257/98
See application file for complete search history.

(56) References Cited

U.S. PATENT DOCUMENTS

| 4,138,530 | A | 2/1979 | Breed et al. |
| 6,556,336 | B2 * | 4/2003 | Hutcheson et al. ........... 359/241 |
| 2003/0178632 | A1 | 9/2003 | Hohn et al. |
| 2009/0189507 | A1 | 7/2009 | Winkler et al. |
| 2010/0061077 | A1 | 3/2010 | Winkler et al. |

FOREIGN PATENT DOCUMENTS

| DE | 29820384 U1 | 1/1999 |
| DE | 102006054331 A1 | 5/2008 |
| WO | 2007/144060 A1 | 12/2007 |

OTHER PUBLICATIONS

International Search Report for PCT/EP2011/004652 (Oct. 13, 2011).
Kong Li et al., "Relationship between Crystal Structure and Luminescence Properties of (Y0.96-x Lnx Ce0.04 )3 Al5 O12 (Ln=Gd, La, Lu) Phosphors", Journal of Rare Earths, vol. 25, No. 6 (Dec. 2007) pp. 692-696.

* cited by examiner

Primary Examiner — Carol M Koslow
(74) Attorney, Agent, or Firm — Millen, White, Zelano & Branigan, P.C.

(57) ABSTRACT

The invention relates to compounds of the general formula (I): $Lu_{3-x-z}A_xAl_{5-y-z}Sc_yO_{12}{:}Mn_zCa_z$, where A stands for Y, Gd or Tb, x stands for a value from the range from 0 to 2.90, y stands for a value from the range from 0 to 0.50, z stands for a value from the range from 0.005 to 0.05, and to a process for the preparation of these phosphors and to the use thereof as conversion phosphors or in lamps.

14 Claims, 16 Drawing Sheets

MN-ACTIVATED PHOSPHORS

The invention relates to $Mn^{4+}$-activated phosphors, to a process for the preparation of these compounds and to the use thereof as conversion phosphors or in lamps.

Luminescent materials are used in fluorescent light sources, emissive display screens and as scintillator crystals for the conversion of invisible radiation or high-energy particles into visible light. A class of materials which has found widespread use for this job are $Ce^{3+}$-doped garnets, in particular $Y_3Al_5O_{12}$:Ce (YAG) and $(Gd_{1-x}Y_x)_3(Al_{1-y}Ga_y)_5O_{12}$:Ce (YAGaG:Ce), where further dopings, such as $Lu^{3+}$ or $Tb^{3+}$, have been used for optimisation of the spectrum.

As long ago as 1996, i.e. shortly after the industrial implementation of blue InGaN LEDs having high energy efficiency and a luminous flux of several candelas, white LEDs were achieved by the partial conversion of the blue light using YAG:Ce or YAGaG:Ce, since the yellow-orange emission colour of these phosphors is complementary to the blue emission colour of the LEDs, and white light can thus be obtained additively.

Until now, all commercially available white LEDs have contained a blue-emitting InGaN chip which is covered with a layer of YAG:Ce or YAGaG:Ce. Essential disadvantages of this approach is on the one hand the dependence of the emission colour on the viewing angle, which is a consequence of the inhomogeneous coating of the chip. On the other hand, the colour reproduction in the case of a light source based on a dichromatic spectrum (blue+yellow-orange) is dependent on the colour temperature and low colour temperatures ($T_c$<5000 K) cannot be achieved with sufficiently high colour reproduction (CRI>80).

That is why, in order to extend the product spectrum and in order to improve the colour reproduction of white LEDs, the principal aim at present is the achievement of trichromatic LEDs. To this end, green- or yellow- and red-emitting phosphors having high absorption in the blue spectral region, having a high quantum yield and a high lumen equivalent must be provided.

A series of suitable red-emitting phosphors, such as, for example, (Ca,Sr)S:Eu, $(Ca,Sr,Ba)_2Si_5N_8$:Eu and (Ca,Sr)$AlSiN_3$:Eu or mixtures of these luminophores, have already been proposed for this purpose in a multiplicity of patent applications.

A disadvantage of the red-emitting phosphors employed to date is their relative low stability, which is partially attributable to the sensitivity to hydrolysis of the sulfidic or nitridic host lattices and partially to the redox lability of the $Eu^{2+}$ activator. In addition, the lumen equivalent of 200-270 lm/W is, owing to the broad emission band, not as high as is known of $Eu^{3+}$ phosphors at 280-360 lm/W. The search for efficient and stable red-emitting phosphors for LEDs having a high lumen equivalent therefore continues undiminished.

The object of the present invention was to develop lutetium-containing garnet phosphors which have red luminescence and are particularly suitable for use in high-power pcLEDs for the generation of warm-white light.

Surprisingly, it has now been found that $Mn^{4+}$-activated lutetium-containing garnet phosphors achieve the above-mentioned object.

The incorporation of tetravalent manganese at the lattice site of trivalent aluminium here must be compensated by the incorporation of a divalent ion, such as $Ca^{2+}$ or $Sr^{2+}$, at the $Lu^{3+}$ site.

A first embodiment of the present invention is therefore a compound of the formula I, $$Lu_{3-x-z}A_xAl_{5-y-z}Sc_yO_{12}:Mn_zCa_z \qquad (I)$$

where
A stands for Y, Gd or Tb
x stands for a value from the range from 0 to 2.90
y stands for a value from the range from 0 to 0.50
z stands for a value from the range from 0.005 to 0.05.
x preferably stands for a value from the range 0 to 2.0 and particularly preferably from the range 0.10 to 0.90.
y preferably stands for a value from the range 0.10 to 0.45, particularly preferably from the range 0.20 to 0.40.

The compounds of the formula I according to the invention are also referred to in a simplified manner below as phosphors.

Phosphors according to the invention give rise to good LED qualities even when employed in small amounts. The LED quality is described by means of conventional parameters, such as, for example, the colour rendering index or the colour point in CIE x and CIE y coordinates.

The colour rendering index or CRI is a dimensionless lighting quantity, familiar to the person skilled in the art, which compares the colour reproduction faithfulness of an artificial light source to that of sunlight or filament light sources (the latter two have a CRI of 100).

CIE x and CIE y stand for the coordinates in the standard CIE colour chart (here standard observer 1931), familiar to the person skilled in the art, by means of which the colour of a light source is described.

All the quantities mentioned above are calculated from emission spectra of the light source by methods familiar to the person skilled in the art.

In the context of this application, the term red light is applied to light whose intensity maximum is at a wavelength between 600 and 680 nm.

The invention furthermore relates to a process for the preparation of a compound of the formula I comprising the following steps:
a) mixing of lutetium-, scandium-, calcium-, aluminium-, manganese-, yttrium-, terbium- and/or gadolinium-containing materials
b) addition of at least one further inorganic and/or organic substance
c) thermal treatment of the mixture.

In the case of the above-mentioned thermal treatment, the reaction is usually carried out at a temperature above 800° C. The thermal treatment is preferably carried out in a multistep process, particularly preferably in a 2-step process, i.e. firstly calcination is carried out under air at a temperature >900° C. and subsequently preferably at a temperature >1500° C., particularly preferably at T=1600 to 1800° C. Alternatively, the calcination can also be carried out under reducing conditions (for example using carbon monoxide, forming gas or hydrogen or oxygen-deficient atmosphere).

The inorganic or organic substance employed (in step b) is a substance from the group of the ammonium halides, alkaline-earth metal fluorides, such as calcium fluoride, strontium fluoride or barium fluoride, alkaline-earth or alkali-metal borates, boric acid, alkaline-earth or alkali-metal carbonates or ammonium hydrogencarbonate, citric acid, alcoholates, as well as oxalates and/or silicates, such as, for example, TEOS. It is preferred to add citric acid and an oxalate. The oxalate may optionally already be added in step a).

The phosphors according to the invention can be prepared either by a conventional solid-state diffusion method (starting from the oxides, nitrates, carbonates or halides of the corresponding alkaline-earth metals, semi-metals, metals or rare earths) or by wet-chemical methods from inorganic and/or organic metal and/or rare-earth salts by means of the sol-gel method, the coprecipitation method and/or the drying method. Preference is given in accordance with the invention to wet-chemical methods, particularly preferably wet-chemical methods by means of addition of citric acid.

In the wet-chemical processes via aqueous precursors of the phosphors, the following methods are known:

Coprecipitation with an $NH_4HCO_3$ solution (see, for example, Jander, *Blasius Lehrbuch der analyt. u. präp. anorg. Chem.* 2002 *[Blasius's Textbook of Analyt. and Prep. Inorg. Chem.* 2002])

Pecchini process with a solution of citric acid and ethylene glycol (see, for example, *Annual Review of Materials Research* Vol. 36: 2006, 281-331)

Combustion process using urea

Spray drying of aqueous or organic salt solutions (starting materials)

Spray pyrolysis of aqueous or organic salt solutions (starting materials)

Evaporation of nitrate solutions and thermal conversion of the residue

Precipitation with a solution comprising citric acid or oxalate

In the above-mentioned coprecipitation, a TEOS/$NH_4HCO_3$ solution is added to, for example, chloride solutions of the corresponding phosphor starting materials, resulting in the formation of the phosphor precursor, which is subsequently converted into the phosphor by one- or multi-step thermal treatment.

In the Pecchini process, a precipitation reagent consisting of citric acid and ethylene glycol is added to, for example, nitrate solutions of the corresponding phosphor starting materials at room temperature, and the mixture is subsequently heated. The increase in viscosity results in the formation of the phosphor precursor.

In the known combustion process, nitrate solutions, for example, of the corresponding starting materials are dissolved in water, the solution is then refluxed, and urea is added, resulting in the slow formation of the phosphor precursor.

Spray pyrolysis is one of the aerosol processes, which are characterised by spraying of solutions, suspensions or dispersions into a reaction space (reactor) heated in various ways and the formation and deposition of solid particles. In contrast to spray drying at hot-gas temperatures <200° C., spray pyrolysis, as a high-temperature process, involves thermal decomposition of the starting materials used (for example salts) and the re-formation of substances (for example oxides or mixed oxides) in addition to evaporation of the solvent.

In the case of precipitation using a solution of citric acid or oxalate, oxides or carbonate solutions, for example, of the corresponding starting materials are dissolved in conc. $HNO_3$, and the above-mentioned solution is subsequently added, before the mixture is then evaporated or filtered. This method is preferred in accordance with the invention.

The first six of the process variants mentioned above are described in detail in WO 2007/144060 (Merck), which is incorporated in its full scope into the context of the present application by way of reference.

The orange/red-emitting phosphors according to the invention can also be mixed with green-emitting phosphors, making such mixtures very highly suitable for applications in general lighting (for example for warm-white LEDs) and LCD backlighting.

A further embodiment of the present invention is therefore a mixture comprising at least one compound of the formula I and at least one green-emitting phosphor, where the latter is preferably selected from Ce-doped garnets, preferably LuAG:Ce, $(Sr,Ca)Si_2N_2O_2$:Eu, $(Sr,Ba)_2SiO_4$:Eu, or $CaSc_2O_4$:Ce,Na.

In accordance with the invention, the compound (or phosphor) of the formula I and the at least one green-emitting phosphor are usually present here in the weight ratio 20:1 to 1:1. It is preferred in accordance with the invention for the at least one phosphor of the formula I and the at least one green-emitting phosphor to be present in the weight ratio 10:1 to 3:1 and particularly preferably 6:1 to 4:1.

The particle size of the phosphors according to the invention is usually between 50 nm and 30 μm, preferably between 1 μm and 20 μm.

In a further preferred embodiment, the phosphors in particle form have a continuous surface coating consisting of $SiO_2$, $TiO_2$, $Al_2O_3$, ZnO, $ZrO_2$ and/or $Y_2O_3$ or mixed oxides thereof. This surface coating has the advantage that, through a suitable grading of the refractive indices of the coating materials, the refractive index can be matched to the environment. In this case, the scattering of light at the surface of the phosphor is reduced and a greater proportion of the light can penetrate into the phosphor and be absorbed and converted therein. In addition, the refractive index-matched surface coating enables more light to be coupled out of the phosphor since total internal reflection is reduced.

In addition, a continuous layer is advantageous if the phosphor has to be encapsulated. This may be necessary in order to counter sensitivity of the phosphor or parts thereof to diffusing water or other materials in the immediate environment. A further reason for encapsulation with a closed shell is thermal decoupling of the actual phosphor from the heat generated in the chip. This heat results in a reduction in the fluorescence light yield of the phosphor and may also influence the colour of the fluorescence light. Finally, a coating of this type enables the efficiency of the phosphor to be increased by preventing lattice vibrations arising in the phosphor from propagating to the environment.

In addition, it is preferred for the phosphors to have a porous surface coating consisting of $SiO_2$, $TiO_2$, $Al_2O_3$, ZnO, $ZrO_2$ and/or $Y_2O_3$ or mixed oxides thereof or of the phosphor composition. These porous coatings offer the possibility of further reducing the refractive index of a single layer. Porous coatings of this type can be produced by three conventional methods, as described in WO 03/027015, which is incorporated in its full scope into the context of the present application by way of reference: the etching of glass (for example soda-lime glasses (see U.S. Pat. No. 4,019,884)), the application of a porous layer, and the combination of a porous layer and an etching operation.

In a further preferred embodiment, the phosphor particles have a surface which carries functional groups which facilitate chemical bonding to the environment, preferably consisting of epoxy or silicone resin. These functional groups can be, for example, esters or other derivatives which are bonded via oxo groups and are able to form links to constituents of the binders based on epoxides and/or silicones. Surfaces of this type have the advantage that homogeneous incorporation of the phosphors into the binder is facilitated. Furthermore, the rheological properties of the phosphor/binder system and also the pot lives can thereby be adjusted to a certain extent. Processing of the mixtures is thus simplified.

Since the phosphor layer applied to an LED chip preferably consists of a mixture of silicone and homogeneous phosphor particles which is applied by bulk casting, and the silicone has a surface tension, this phosphor layer is not uniform at a microscopic level or the thickness of the layer is not constant throughout. This is generally also the case if the phosphor is not applied by the bulk-casting process, but instead in the so-called chip-level conversion process, in which a highly concentrated, thin phosphor layer is applied directly to the surface of the chip with the aid of electrostatic methods.

With the aid of the above-mentioned process, it is possible to produce any desired outer shapes of the phosphor particles, such as spherical particles, flakes and structured materials and ceramics.

The preparation of flake-form phosphors as a further preferred embodiment is carried out by conventional processes from the corresponding metal and/or rare-earth salts. The preparation process is described in detail in EP 763573 and DE 102006054331, which are incorporated in their full scope into the context of the present application by way of reference. These flake-form phosphors can be prepared by coating a natural or synthetically prepared, highly stable support or a substrate comprising, for example, mica, $SiO_2$, $Al_2O_3$, $ZrO_2$, glass or $TiO_2$ flakes which has a very large aspect ratio, an atomically smooth surface and an adjustable thickness with a phosphor layer by a precipitation reaction in aqueous dispersion or suspension. Besides mica, $ZrO_2$, $SiO_2$, $Al_2O_3$, glass or $TiO_2$ or mixtures thereof, the flakes may also consist of the phosphor material itself, or be built up from another material. If the flake itself merely serves as support for the phosphor coating, the latter must consist of a material which is transparent to the primary radiation of the LED, or absorbs the primary radiation and transfers this energy to the phosphor layer. The flake-form phosphors are dispersed in a resin (for example silicone or epoxy resin), and this dispersion is applied to the LED chip.

The flake-form phosphors can be prepared on a large industrial scale in thicknesses of 50 nm to about 20 μm, preferably between 150 nm and 5 μm. The diameter here is 50 nm to 20 μm.

It generally has an aspect ratio (ratio of the diameter to the particle thickness) of 1:1 to 400:1 and in particular 3:1 to 100:1.

The flake dimensions (length×width) are dependent on the arrangement. Flakes are also suitable as centres of scattering within the conversion layer, in particular if they have particularly small dimensions.

The surface of the flake-form phosphor according to the invention facing the LED chip can be provided with a coating which has an antireflection action with respect to the primary radiation emitted by the LED chip. This results in a reduction in back-scattering of the primary radiation, enabling the latter to be coupled better into the phosphor body according to the invention. Suitable for this purpose are, for example, coatings of matched refractive index, which must have a following thickness d: d=[wavelength of the primary radiation of the LED chip/(4*refractive index of the phosphor ceramic)], see, for example, Gerthsen, Physik [Physics], Springer Verlag, 18th Edition, 1995. This coating may also consist of photonic crystals, which also includes structuring of the surface of the flake-form phosphor in order to achieve certain functionalities.

The preparation of the phosphors according to the invention in the form of ceramic bodies is carried out analogously to the process described in DE 102006037730 (Merck), which is incorporated in its full scope into the context of the present application by way of reference. In this process, the phosphor is prepared by wet-chemical methods by mixing the corresponding starting materials and dopants, subsequently subjected to isostatic pressing and applied directly to the surface of the chip in the form of a homogeneous, thin and non-porous flake. There is thus no location-dependent variation of the excitation and emission of the phosphor, which means that the LED provided therewith emits a homogeneous light cone of constant colour and has high light output. The ceramic phosphor bodies can be produced on a large industrial scale, for example, as flakes in thicknesses of a few 100 nm to about 500 μm. The flake dimensions (length×width) are dependent on the arrangement. In the case of direct application to the chip, the size of the flake should be selected in accordance with the chip dimensions (from about 100 μm*100 μm to several $mm^2$) with a certain oversize of about 10% to 30% of the chip surface with a suitable chip arrangement (for example flip-chip arrangement) or correspondingly. If the phosphor flake is installed over a finished LED, all of the exiting light cone passes through the flake.

The side surfaces of the ceramic phosphor body can be coated with a light metal or noble metal, preferably aluminium or silver. The metal coating has the effect that light does not exit laterally from the phosphor body. Light exiting laterally can reduce the luminous flux to be coupled out of the LED. The metal coating of the ceramic phosphor body is carried out in a process step after the isostatic pressing to give rods or flakes, where the rods or flakes can optionally be cut to the requisite size before the metal coating. To this end, the side surfaces are wetted, for example, with a solution comprising silver nitrate and glucose and subsequently exposed to an ammonia atmosphere at elevated temperature. A silver coating, for example, forms on the side surfaces in the process.

Alternatively, currentless metallisation processes are also suitable, see, for example, Hollemann-Wiberg, Lehrbuch der Anorganic Chemie [Textbook of Inorganic Chemistry], Walter de Gruyter Verlag or Ullmanns Enzyklopädie der chemischen Technologie [Ullmann's Encyclopaedia of Chemical Technology].

The ceramic phosphor body can, if necessary, be fixed to the baseboard of an LED chip using a water-glass solution.

In a further embodiment, the ceramic phosphor body has a structured (for example pyramidal) surface on the side opposite an LED chip. This enables as much light as possible to be coupled out of the phosphor body. The structured surface on the phosphor body is produced by carrying out the isostatic pressing using a compression mould having a structured pressure plate and thus embossing a structure into the surface. Structured surfaces are desired if the aim is to produce the thinnest possible phosphor bodies or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are ⅔ to ⅚ of the melting point of the substance to be pressed.

In addition, the phosphors according to the invention can be excited over a broad range, extending from about 410 nm to 530 nm, preferably 430 nm to about 500 nm. These phosphors are thus not only suitable for excitation by violet- or blue-emitting light sources, such as LEDs or conventional discharge lamps (for example based on Hg), but also for light sources such as those which utilise the blue $In^{3+}$ line at 451 nm.

The present invention furthermore relates to a light source, characterised in that it comprises a semiconductor and at least one compound or phosphor of the formula I.

The present invention furthermore relates to a light source, characterised in that it comprises a semiconductor and at least one compound of the formula I and at least one green-emitting phosphor. This lighting unit is preferably white-emitting or emits light having a certain colour point (colour-on-demand principle).

The colour-on-demand concept is taken to mean the production of light having a certain colour point using a pcLED (=phosphor-converted LED) using one or more phosphors. This concept is used, for example, in order to produce certain corporate designs, for example for illuminated company logos, trademarks, etc.

In a preferred embodiment of the light source according to the invention, the semiconductor is a luminescent indium aluminium gallium nitride, in particular of the formula

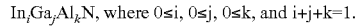
$In_iGa_jAl_kN$, where $0 \leq i$, $0 \leq j$, $0 \leq k$, and $i+j+k=1$.

In a further preferred embodiment of the light source according to the invention, the light source is a luminescent arrangement based on ZnO, TCO (transparent conducting oxide), ZnSe or SiC or an arrangement based on an organic light-emitting layer (OLED).

In a further preferred embodiment of the light source according to the invention, the light source is a source which exhibits electroluminescence and/or photoluminescence. The light source may furthermore also be a plasma or discharge source.

Possible forms of light sources of this type are known to the person skilled in the art. These can be light-emitting LED chips of various structure.

The phosphors according to the invention can either be dispersed in a resin (for example epoxy or silicone resin) or, in the case of suitable size ratios, arranged directly on the light source or alternatively arranged remote therefrom, depending on the application (the latter arrangement also includes "remote phosphor technology"). The advantages of remote phosphor technology are known to the person skilled in the art and are revealed, for example, by the following publication: Japanese Journ. of Appl. Phys. Vol. 44, No. 21 (2005) L649-L651.

The invention furthermore relates to a lighting unit, in particular for the backlighting of display devices, which is characterised in that it comprises at least one light source described above, and to corresponding display devices, in particular liquid-crystal display devices (LC displays), having backlighting, which are characterised in that they comprise at least one lighting unit of this type.

Preference is furthermore given to a lighting unit, in particular for general lighting, which is characterised in that it has a CRI (=colour rendering index) >60, preferably >70, more preferably >85. However, CRI values >85 can only be achieved if the red phosphor of the formula I according to the invention is additionally combined with green phosphors in the LED.

In a further embodiment, it is preferred for the optical coupling of the lighting unit between the phosphor and the semiconductor to be achieved by a light-conducting arrangement.

This makes it possible for the semiconductor to be installed at a central location and to be optically coupled to the phosphor by means of light-conducting devices, such as, for example, optical fibres. In this way, it is possible to achieve lamps adapted to the lighting wishes which merely consist of one or various phosphors, which can be arranged to form a light screen, and an optical waveguide, which is coupled to the light source. In this way, it is possible to place a strong light source at a location which is favourable for electrical installation and to install lamps comprising phosphors which are coupled to the optical waveguides at any desired locations without further electrical cabling, but instead only by laying optical waveguides.

The present invention furthermore relates to the use of the phosphors according to the invention for the partial or complete conversion of the blue or near-UV emission from a luminescent diode.

Preference is furthermore given to the use of the phosphors according to the invention for the conversion of the blue or near-UV emission into visible white radiation. Preference is furthermore given to the use of the phosphors according to the invention for the conversion of the primary radiation into a certain colour point in accordance with the "colour-on-demand" concept.

The present invention furthermore relates to the use of the phosphors according to the invention in electroluminescent materials, such as, for example, electroluminescent films (also known as lighting films or light films), in which, for example, zinc sulfide or zinc sulfide doped with $Mn^{2+}$, $Cu^+$ or $Ag^+$ is employed as emitter, which emit in the yellow-green region. The areas of application of the electroluminescent film are, for example, advertising, display backlighting in liquid-crystal display screens (LC displays) and thin-film transistor (TFT) displays, self-illuminating vehicle licence plates, floor graphics (in combination with a crush-resistant and slip-proof laminate), in display and/or control elements, for example in automobiles, trains, ships and aircraft, or also domestic appliances, garden equipment, measuring instruments or sport and leisure equipment.

The following examples are intended to illustrate the present invention. However, they should in no way be regarded as limiting. All compounds or components which can be used in the compositions are either known and commercially available or can be synthesised by known methods. The temperatures indicated in the examples are always in ° C. It furthermore goes without saying that, both in the description and also in the examples, the added amounts of the components in the compositions always add up to a total of 100%. Percentage data given should always be regarded in the given context. However, they usually always relate to the weight of the part-amount or total amount indicated.

Even without further comments, it is assumed that a person skilled in the art will be able to utilise the above description in its broadest scope. The preferred embodiments should therefore merely be regarded as descriptive disclosure which is absolutely not limiting in any way. The complete disclosure content of all applications and publications mentioned above and below is incorporated into this application by way of reference.

EXAMPLES

Example 1

Preparation of $Lu_{2.995}Al_{4.995}O_{12}:Mn_{0.005}Ca_{0.005}$ 5.0125 g (0.0126 mol) of $Y_2O_3$, 0.0042 g of $CaCO_3$ (4.2115*10$^{-5}$ mol) and 0.0075 g (4.2115*10$^{-5}$ mol) of $MnC_2O_4*2H_2O$ are dissolved in conc. $HNO_3$ with warming. 15.7827 g (0.0427 mol) of $Al(NO_3)_3*9H_2O$ in 300 ml of water are added to this solution and subsequently 10 g of citric acid, with stirring being carried out for 30 min. The solution is dried overnight in a drying cabinet at 150° C., and the resultant citrate precursor is finely ground. The powder is calcined at 1000° C. for 3 h and then calcined at 1750° C. in air for 5 h.

Example 2

Preparation of $Lu_{2.995}Al_{4.495}Sc_{0.5}O_{12}:Mn_{0.005}Ca_{0.005}$ 5.0125 g of $Lu_2O_3$ and 0.5808 g of $Sc_2O_3$ are dissolved in conc. $HNO_3$ with warming, and 0.0042 g of $CaCO_3$ is then added.

14.2028 of $Al(NO_3)_3*9H_2O$ and 0.0075 g of manganese oxalate are dissolved in dist. water and added to the previous solution.

10 g of citric acid are added to this solution and stirred for 30 min with warming. The solution is evaporated overnight in a drying cabinet at 130° C., and the resultant citrate precursor is finely ground. The powder is calcined at 1000° C. for 3 h and then calcined at 1700° C. in air for 4 h.

Example 3

Preparation of $Lu_{1.4975}Y_{1.4975}Al_{4.995}O_{12}$: $Mn_{0.005}Ca_{0.005}$ 2.507 g of $Lu_2O_3$ and 1.4226 g of $Y_2O_3$ are dissolved in conc. $HNO_3$ with warming, and 4.2 mg of $CaCO_3$ are added. 15.783 g of $Al(NO_3)_3*9H_2O$ and 7.5 mg of manganese oxalate are dissolved in dist. water and added to the previous solution. 10 g of citric acid are added to this solution and stirred for 30 min with warming. The solution is evaporated overnight in a drying cabinet at 130° C., and the resultant citrate precursor is ground. The powder is calcined at 1000° C. for 3 h and then calcined at 1700° C. in air for 4 h Example 4

Preparation of $Lu_{1.4975}Gd_{1.4975}Al_{4.995}O_{12}$: $Mn_{0.005}Ca_{0.005}$ 23.507 g of $Lu_2O_3$ and 2.284 g of $Gd_2O_3$ are dissolved in conc. $HNO_3$ with warming, 4.2 mg of $CaCO_3$ are then added to this solution. 15.783 g of $Al(NO_3)_3*9H_2O$ and 7.5 mg of manganese oxalate are dissolved in dist. water and added to the previous solution. 10 g amount of citric acid are added to this solution and stirred for 30 min with warming. The solution is evaporated overnight in a drying cabinet at 130° C., and the resultant citrate precursor is ground. The powder is calcined at 1000° C. for 3 h and then calcined at 1700° C. in air for 4 h Example 5

Production of a Light-Emitting Diode

A phosphor from Examples 1 to 4 is mixed with a 2-component silicone (OE6550 from Dow Corning) in a tumble mixer in such a way that equal amounts of the phosphor are dispersed in the two components of the silicone, the total concentration of the phosphor mixture in the silicone is 8% by weight.

5 ml of each of the two phosphor-containing silicone components are mixed homogeneously with one another and transferred into a dispenser. Empty LED packages from OSA optoelectronics, Berlin, which contain a 100 μm² GaN chip are filled with the aid of the dispenser. The LEDs are then placed in a heat chamber in order to solidify the silicone over 1 h at 150° C.

| Composition | Emission max [nm] | CIE 1931 |
|---|---|---|
| $Lu_{2.995}Ca_{0.005}Al_{4.995}Mn_{0.005}O_{12}$ | 664 637 | X: 0.713 Y: 0.283 |
| $Lu_{2.995}Ca_{0.005}Al_{4.495}Mn_{0.005}Sc_{0.5}O_{12}$ | 664 651 637 | X: 0.713 Y: 0.283 |
| $Lu_{1.4975}Y_{1.4975}Ca_{0.005}Al_{4.995}Mn_{0.005}O_{12}$ | 671 641 | X: 0.720 Y: 0.277 |
| $Lu_{1.4975}Gd_{1.4975}Ca_{0.005}Al_{4.995}Mn_{0.005}O_{12}$ | 674 | X: 0.717 Y: 0.282 |

Table 1 shows the optical properties of the phosphors according to the invention CIE x and CIE y stand for the coordinates in the standard CIE colour chart (here standard observer 1931), familiar to the person skilled in the art, by means of which the colour of a light source is described.

All the quantities mentioned above are calculated from emission spectra of the light source by methods familiar to the person skilled in the art.

DESCRIPTION OF THE FIGURES

It should be pointed out that the phosphor compositions in the following 16 figure descriptions are in each case indicated by the abbreviated notation, as are usual in laser physics. This means, for example, $Lu_{2.995}Al_{4.995}O_{12}$: $Mn_{0.005}Ca_{0.005}$ is indicated in abbreviated notation as "$Lu_3Al_5O_{12}$: $Mn^{4+}$ (0.1%), $Ca^{2+}$(0.1%)".

Figure 1A:
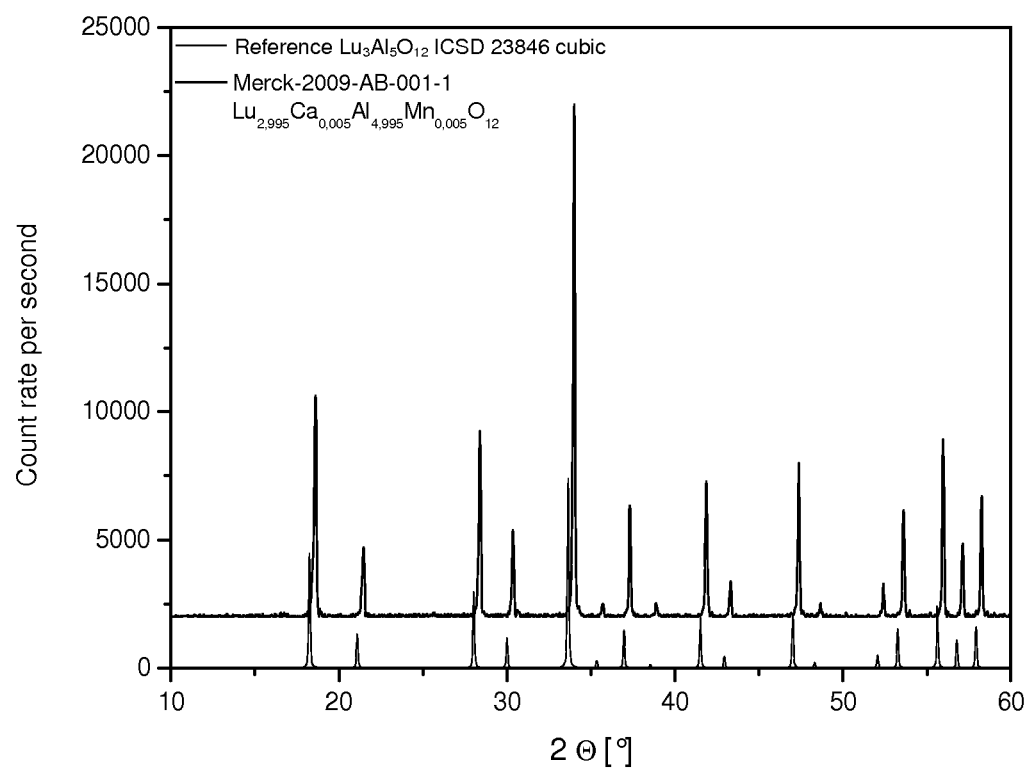
FIG. 1a: shows a comparison of the X-ray diffraction patterns of phosphors of the composition $Lu_3Al_5O_{12}$:$Mn^{4+}$ (0.1%), $Ca^{2+}$(0.1%) in comparison with the diffraction pattern of the reference $Lu_3Al_5O_{12}$. The X-ray diffraction patterns were recorded with a Rigaku Miniflux II using Cu—K-alpha radiation. The measurement range 2theta was 10-60°.
Figure 1B:
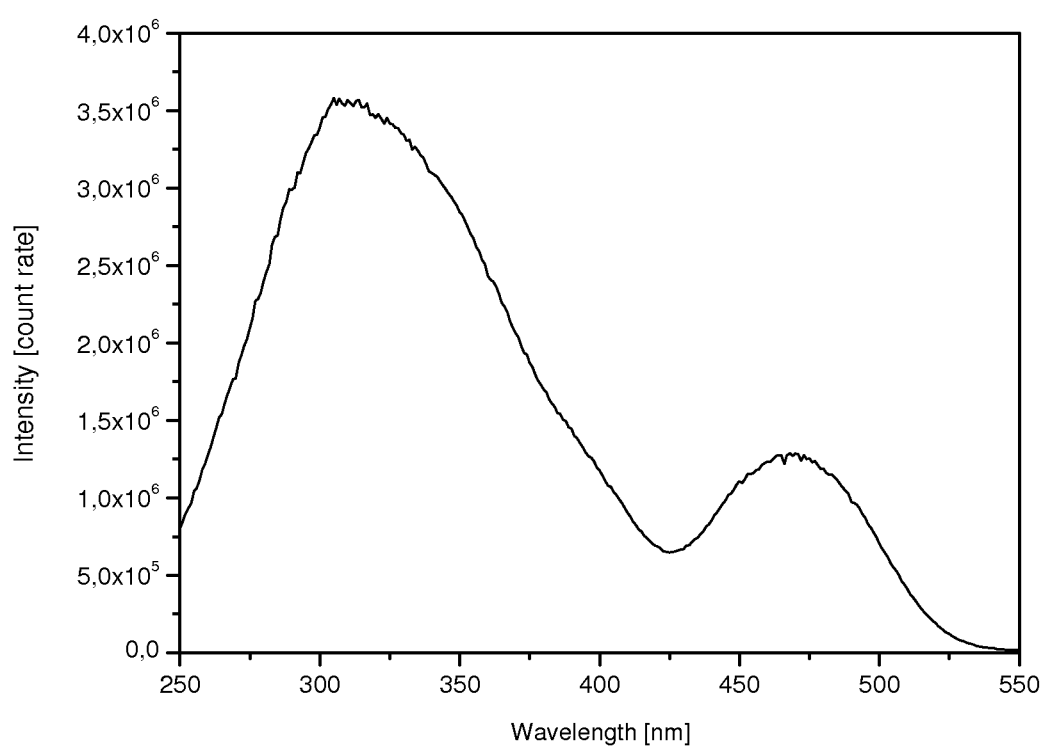
FIG. 1b: shows an excitation spectrum of $Lu_3Al_5O_{12}$:$Mn^{4+}$ (0.1%), $Ca^{2+}$(0.1%). The spectrum was recorded on a powder layer of semi-infinite thickness with an Edinburgh Instruments FL920 spectrometer using an Xe high-pressure lamp and a Hamamatsu photomultiplier at room temperature.
Figure 1C:
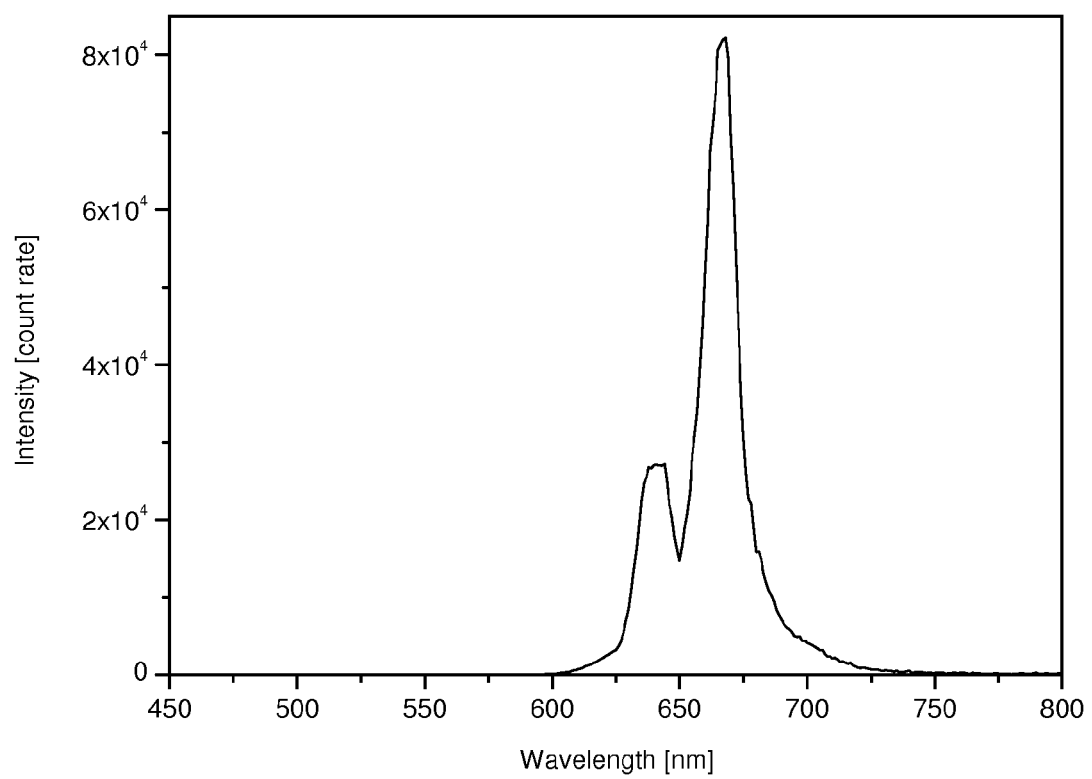
FIG. 1c: shows the standardised emission spectrum of $Lu_3Al_5O_{12}$:$Mn^{4+}$(0.1%), $Ca^{2+}$(0.1%) The spectrum was recorded on a powder layer of semi-infinite thickness with an Edinburgh Instruments FL920 spectrometer using an Xe high-pressure lamp and a Hamamatsu photomultiplier at room temperature.
Figure 1D:
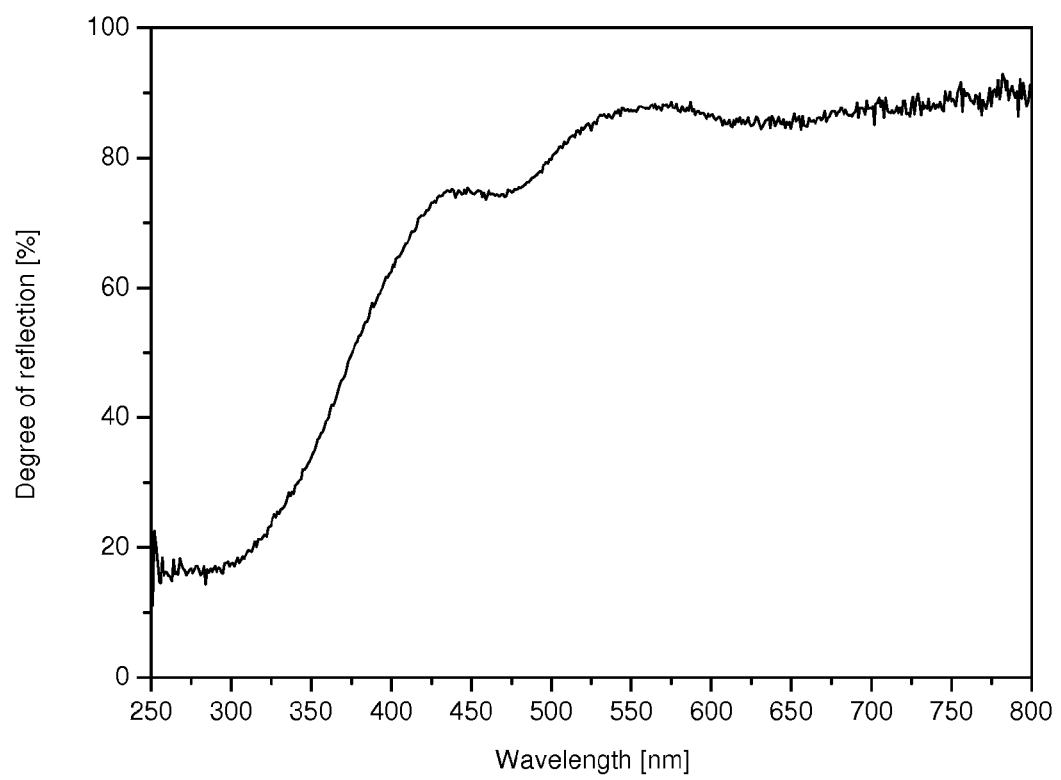
FIG. 1d: shows a reflection spectrum of $Lu_3Al_5O_{12}$:$Mn^{4+}$ (0.1%), $Ca^{2+}$(0.1%) The spectrum was recorded on a powder layer of semi-infinite thickness with an Edinburgh Instruments FS920 spectrometer in an Ulbricht sphere using an Xe high-pressure lamp and a Hamamatsu photomultiplier at room temperature.
Figure 2A:
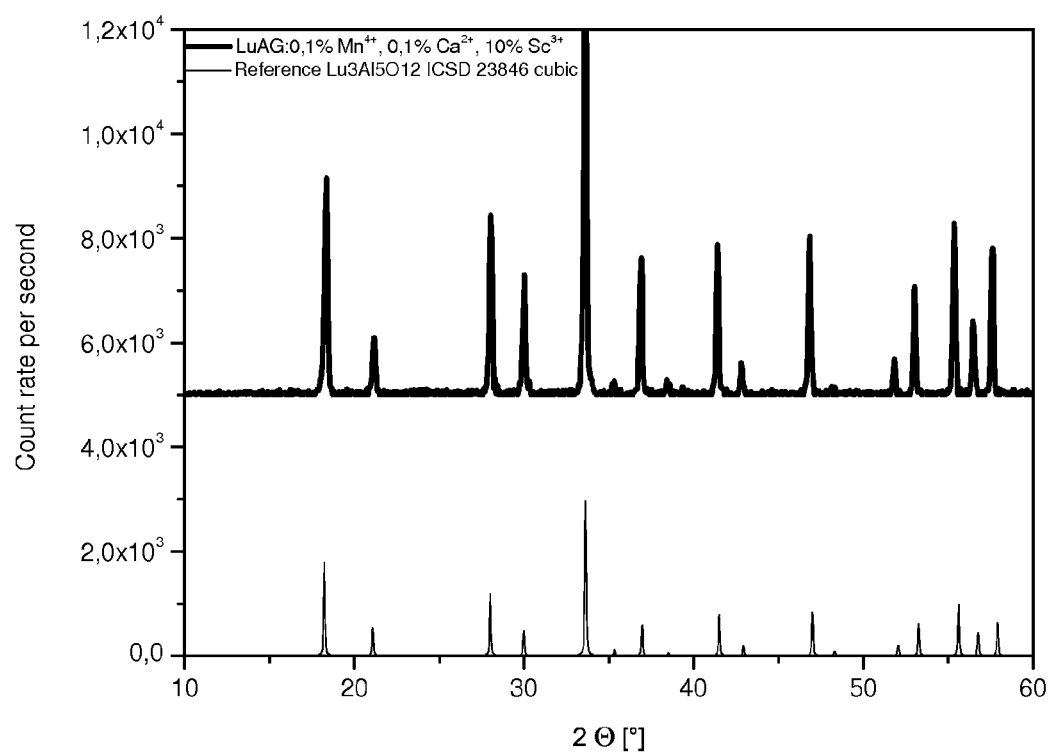
FIG. 2a: shows a comparison of the X-ray diffraction patterns of phosphors of the composition $Lu_3Al_{4.5}Sc_{0.5}O_{12}$:Mn (0.1%),Ca(0.1%) in comparison with the diffraction pattern of the reference $Lu_3Al_5O_{12}$. The X-ray diffraction patterns were recorded with a Rigaku Miniflux II using Cu—K-alpha radiation. The measurement range 2theta was 10-60°.
Figure 2B:
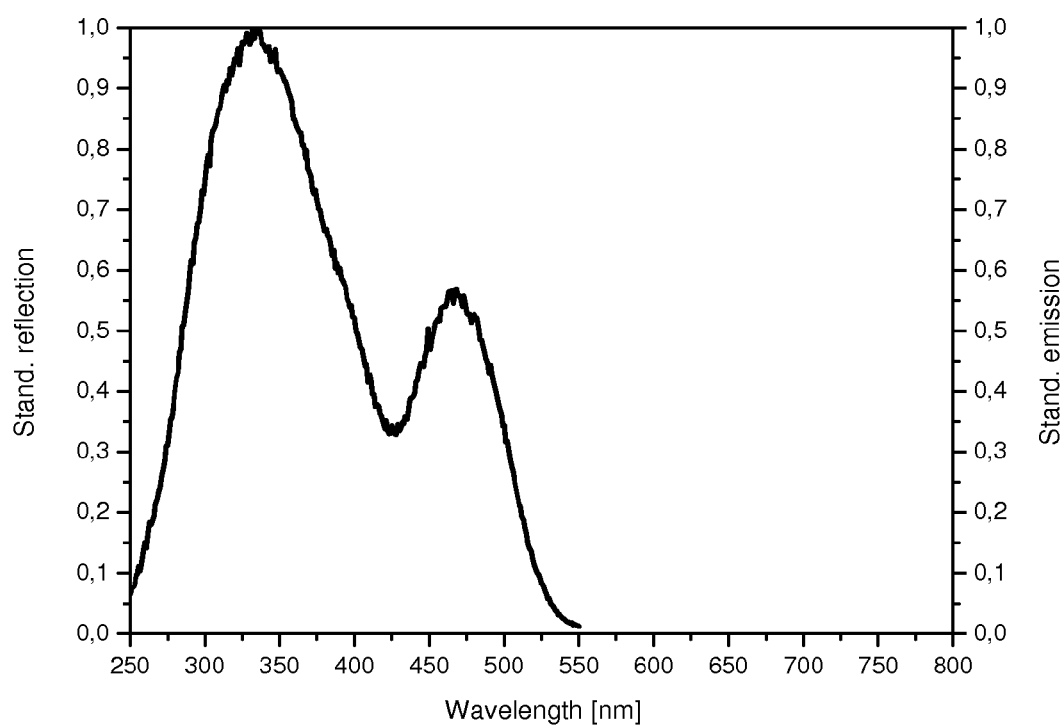
FIG. 2b: shows an excitation spectrum of $Lu_3Al_{4.5}Sc_{0.5}O_{12}$:Mn(0.1%), Ca(0.1%). The spectrum was recorded on a powder layer of semi-infinite thickness with an Edinburgh Instruments FL920 spectrometer using an Xe high-pressure lamp and a Hamamatsu photomultiplier at room temperature.
Figure 2C:
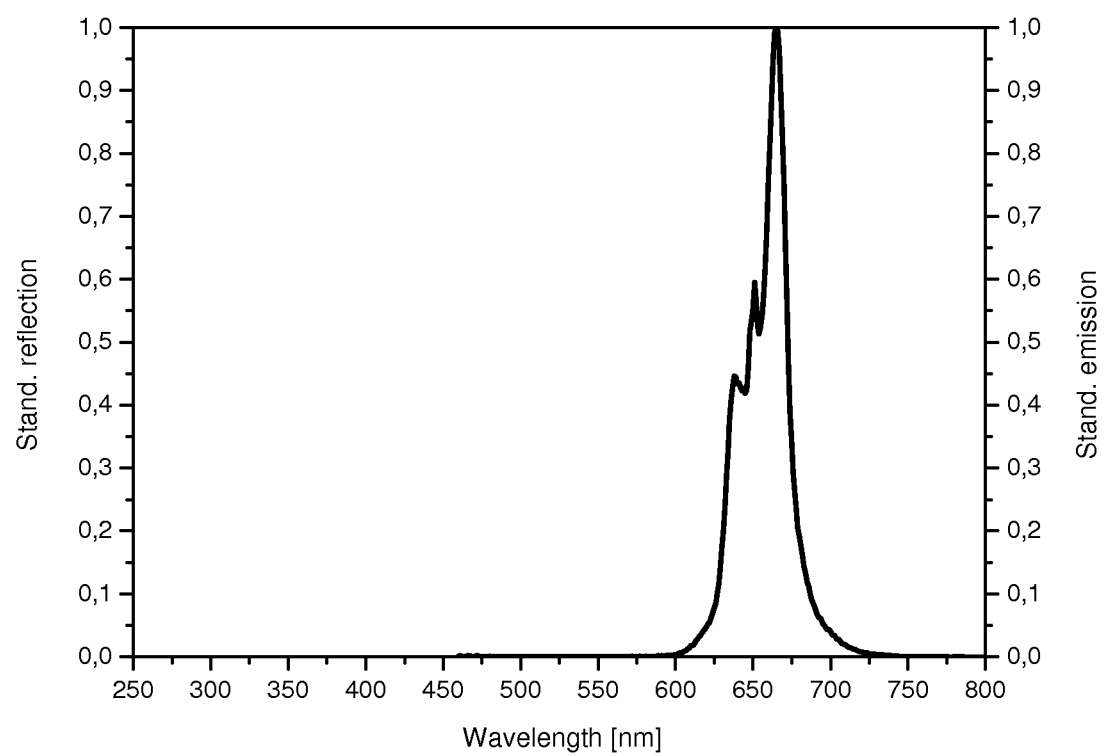
FIG. 2c: shows the standardised emission spectrum of $Lu_3Al_{4.5}Sc_{0.5}O_{12}$:Mn(0.1%), Ca(0.1%). The spectrum was recorded on a powder layer of semi-infinite thickness with an Edinburgh Instruments FL920 spectrometer using an Xe high-pressure lamp and a Hamamatsu photomultiplier at room temperature.
Figure 2D:
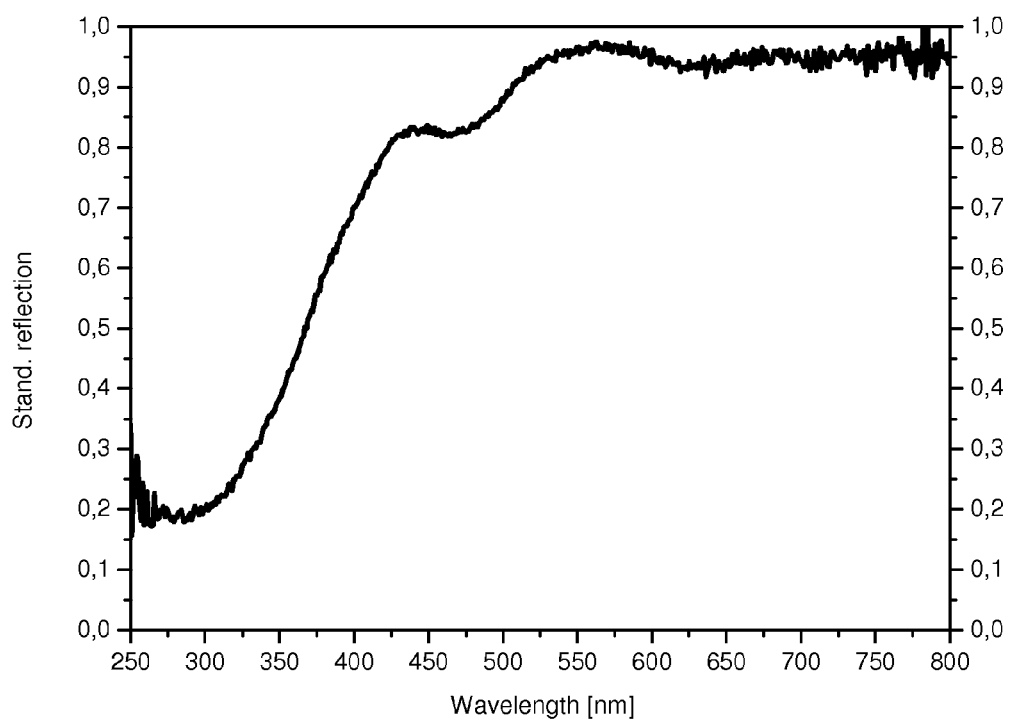
FIG. 2d: shows a reflection spectrum of $Lu_3Al_{4.5}Sc_{0.5}O_{12}$: Mn(0.1%), Ca(0.1%). The spectrum was recorded on a powder layer of semi-infinite thickness with an Edinburgh Instruments FS920 spectrometer in an Ulbricht sphere using an Xe high-pressure lamp and a Hamamatsu photomultiplier at room temperature.
Figure 3A:
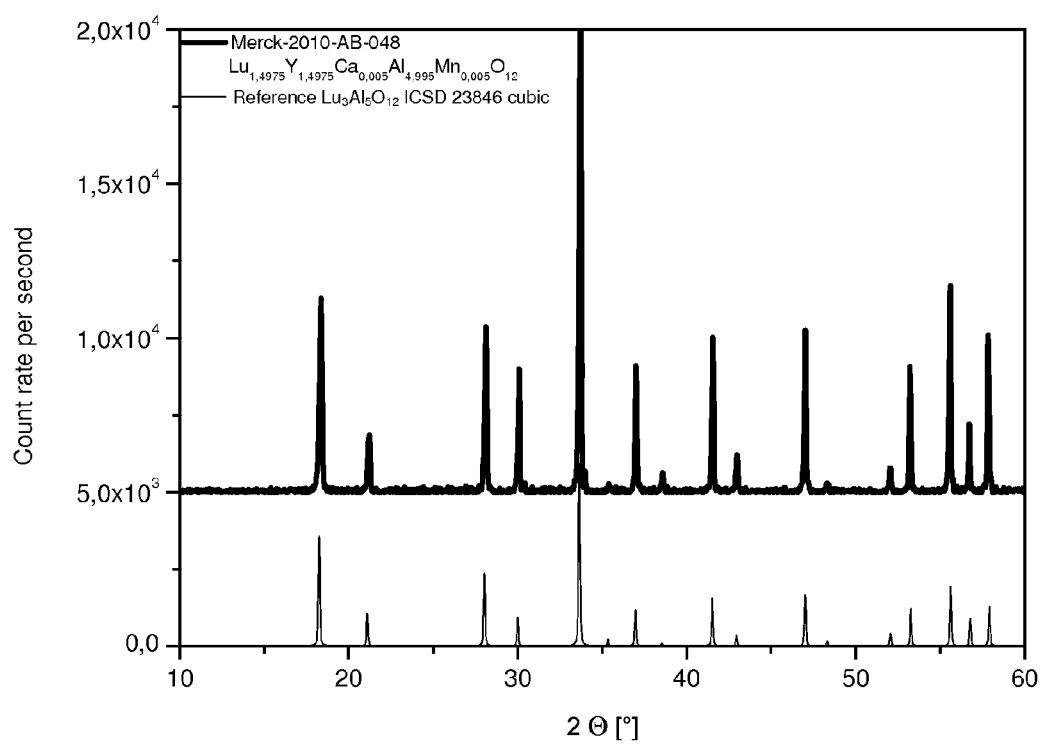
FIG. 3a: shows a comparison of the X-ray diffraction patterns of phosphors of the composition $(Lu_{0.5}Y_{0.5})_3Al_5O_{12}$:Mn(0.1%), Ca(0.1%) in comparison with the diffraction pattern of the reference $Lu_3Al_5O_{12}$. The X-ray diffraction patterns were recorded with a Rigaku Miniflux II using Cu—K-alpha radiation. The measurement range 2theta was 10-60°.
Figure 3B:
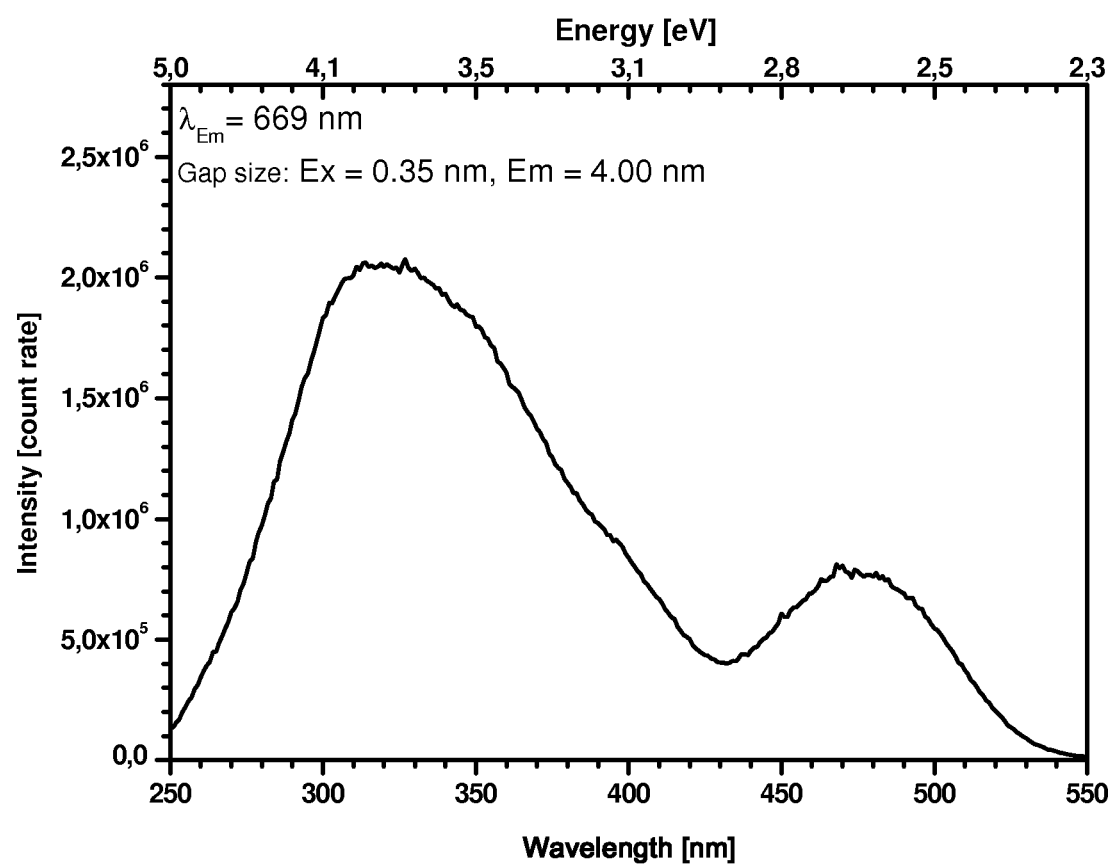
FIG. 3b: shows an excitation spectrum of $(Lu_{0.5}Y_{0.5})_3Al_5O_{12}$:Mn(0.1%) Ca(0.1%). The spectrum was recorded on a powder layer of semi-infinite thickness with an Edinburgh Instruments FL920 spectrometer using an Xe high-pressure lamp and a Hamamatsu photomultiplier at room temperature.
Figure 3C:
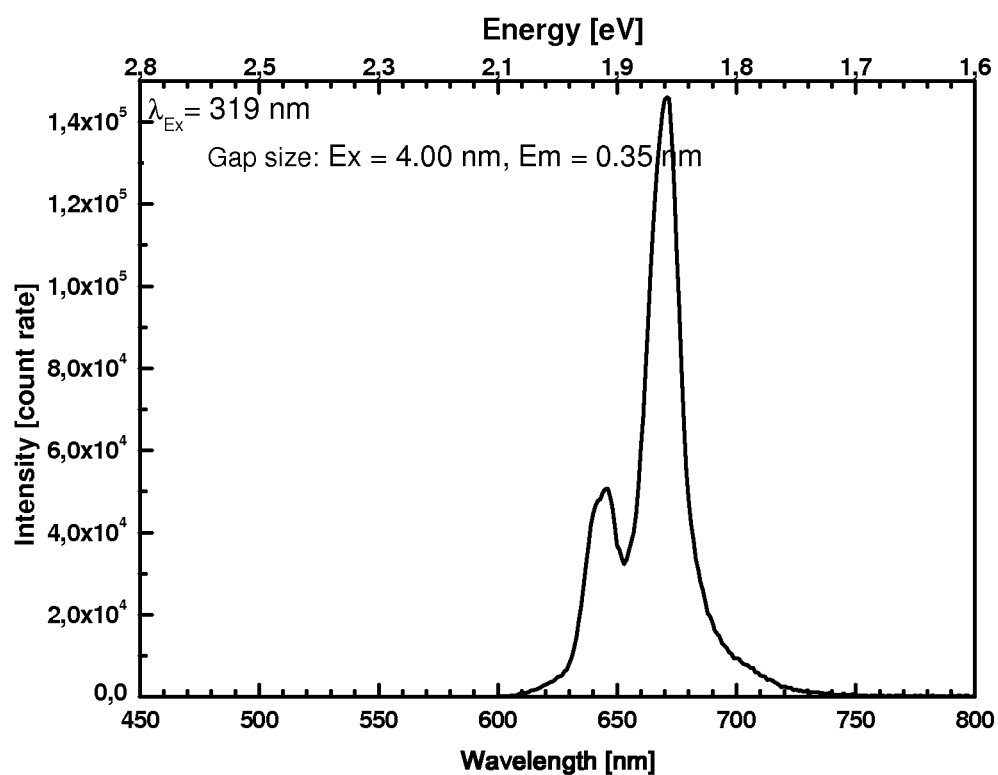
FIG. 3c: shows the standardised emission spectrum of $(Lu_{0.5}Y_{0.5})_3Al_5O_{12}$:Mn(0.1%),Ca(0.1%). The spectrum was recorded on a powder layer of semi-infinite thickness with an Edinburgh Instruments FL920 spectrometer using an Xe high-pressure lamp and a Hamamatsu photomultiplier at room temperature.
Figure 3D:
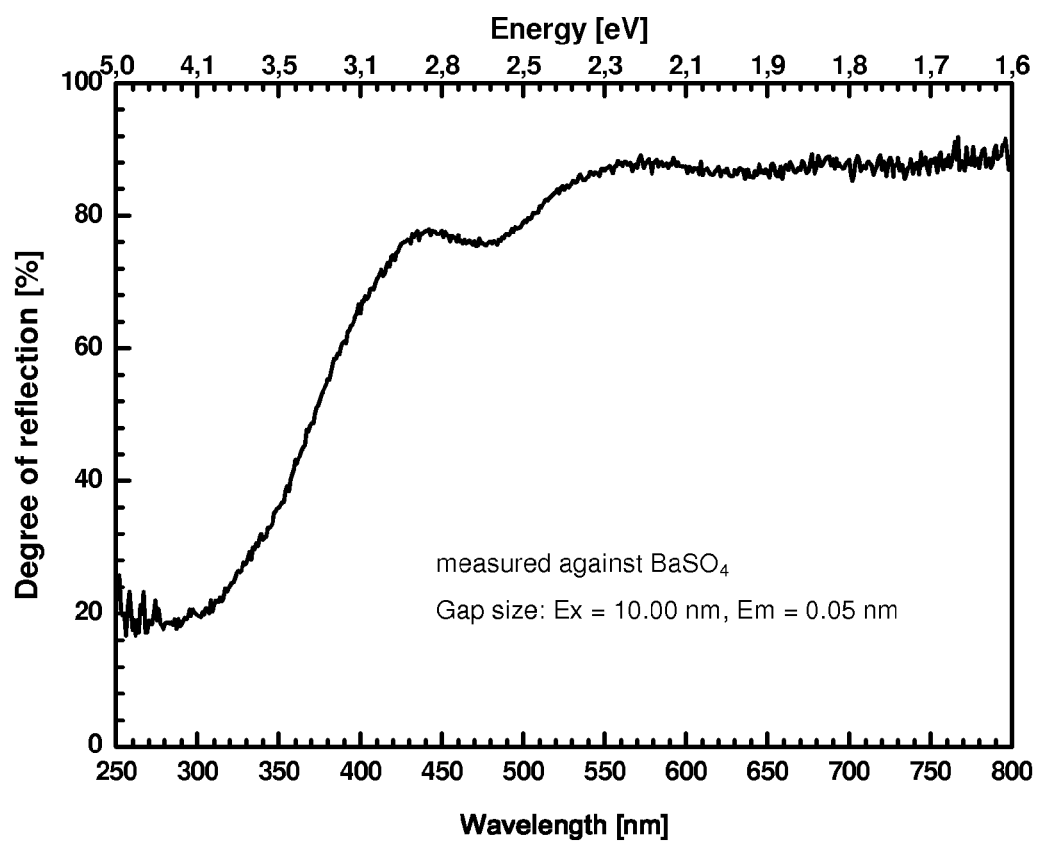
FIG. 3d: shows a reflection spectrum of $(Lu_{0.5}Y_{0.5})_3Al_5O_{12}$:Mn(0.1%), Ca(0.1%). The spectrum was recorded on a powder layer of semi-infinite thickness with an Edinburgh Instruments FS920 spectrometer in an Ulbricht sphere using an Xe high-pressure lamp and a Hamamatsu photomultiplier at room temperature.
Figure 4A:
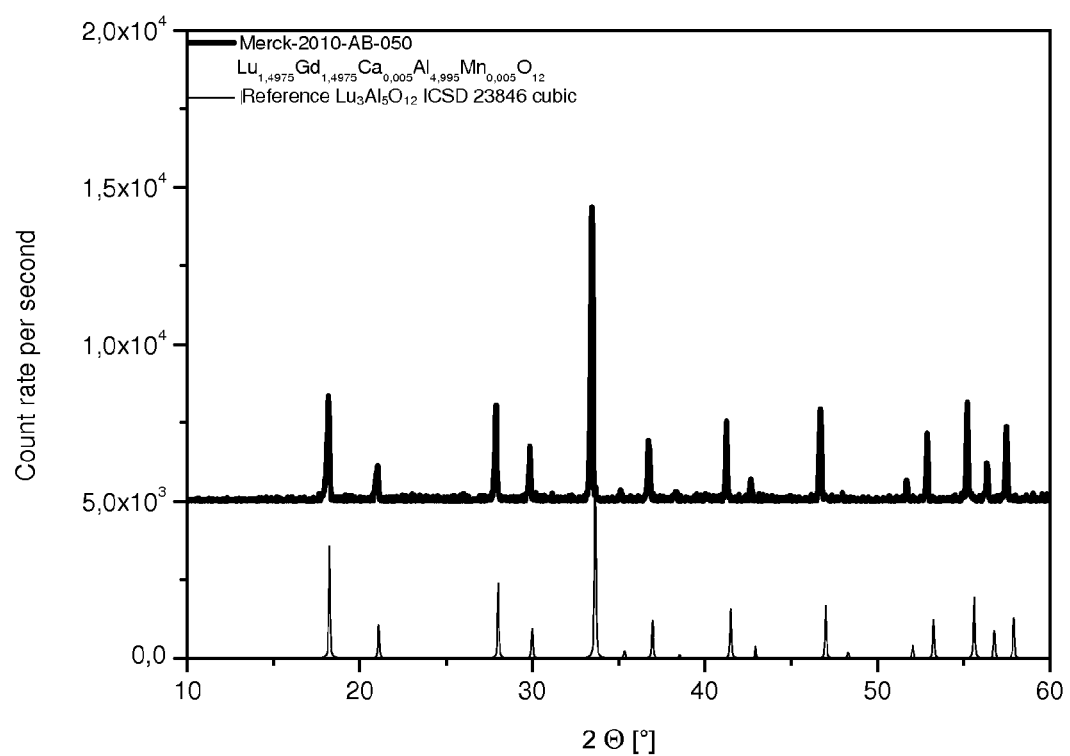
FIG. 4a: shows a comparison of the X-ray diffraction patterns of phosphors of the composition $(Lu_{0.5}Gd_{0.5})_3Al_5O_{12}$:Mn(0.1%), Ca(0.1%) in comparison with the diffraction pattern of the reference $Lu_3Al_5O_{12}$. The X-ray diffraction patterns were recorded with a Rigaku Miniflux II using Cu—K-alpha radiation. The measurement range 2theta was 10-60°.
Figure 4B:
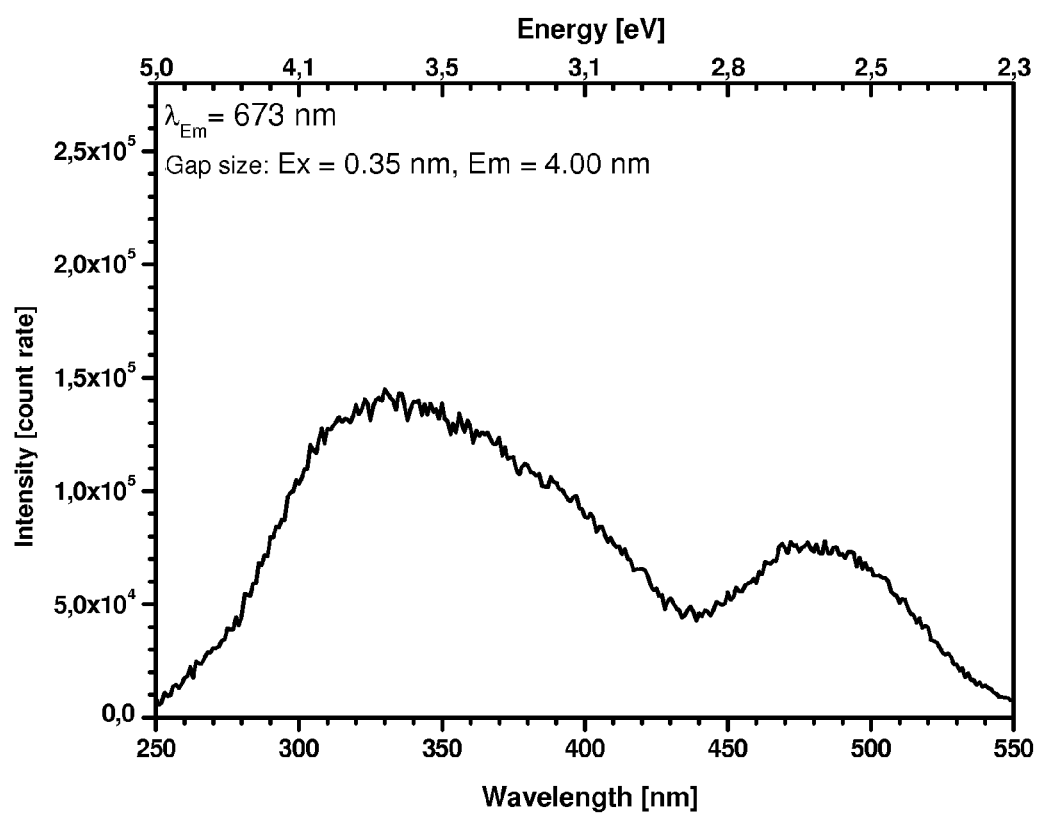
FIG. 4b: shows an excitation spectrum of $(Lu_{0.5}Gd_{0.5})_3Al_5O_{12}$:Mn(0.1%), Ca(0.1%). The spectrum was recorded on a powder layer of semi-infinite thickness with an Edinburgh Instruments FL920 spectrometer using an Xe high-pressure lamp and a Hamamatsu photomultiplier at room temperature.
Figure 4C:
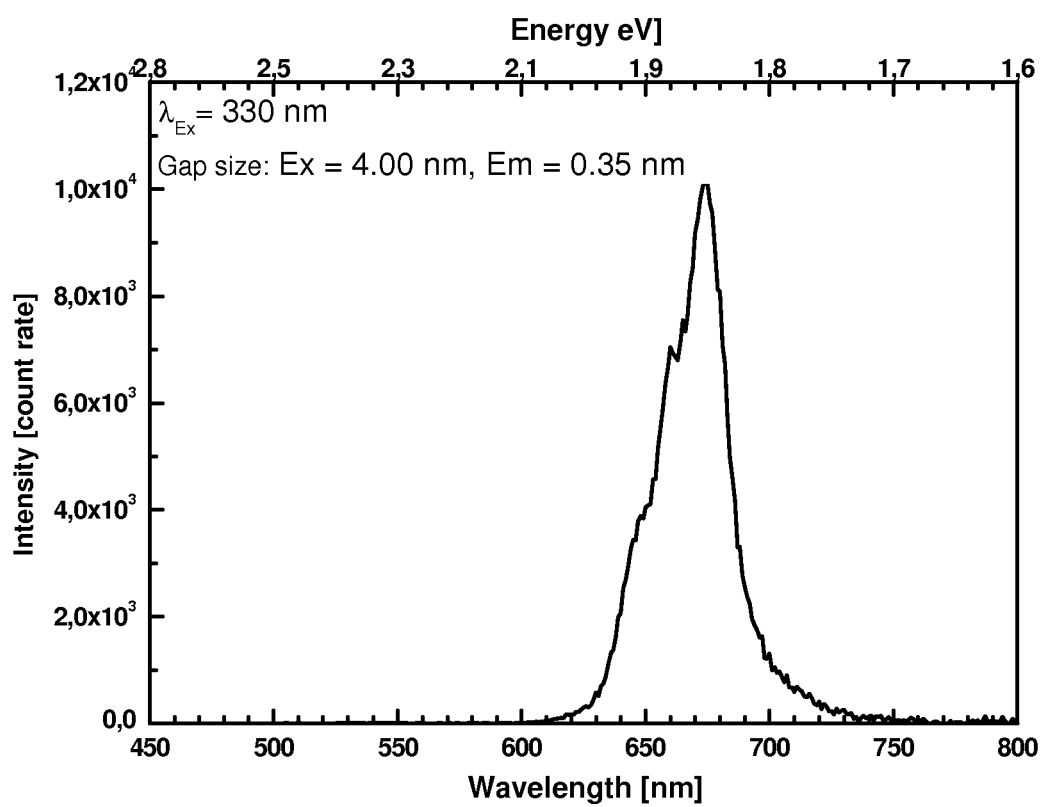
FIG. 4c: shows the standardised emission spectrum of $(Lu_{0.5}Gd_{0.5})_3Al_5O_{12}$:Mn(0.1%),Ca(0.1%). The spectrum was recorded on a powder layer of semi-infinite thickness with an Edinburgh Instruments FL920 spectrometer using an Xe high-pressure lamp and a Hamamatsu photomultiplier at room temperature.
Figure 4D:
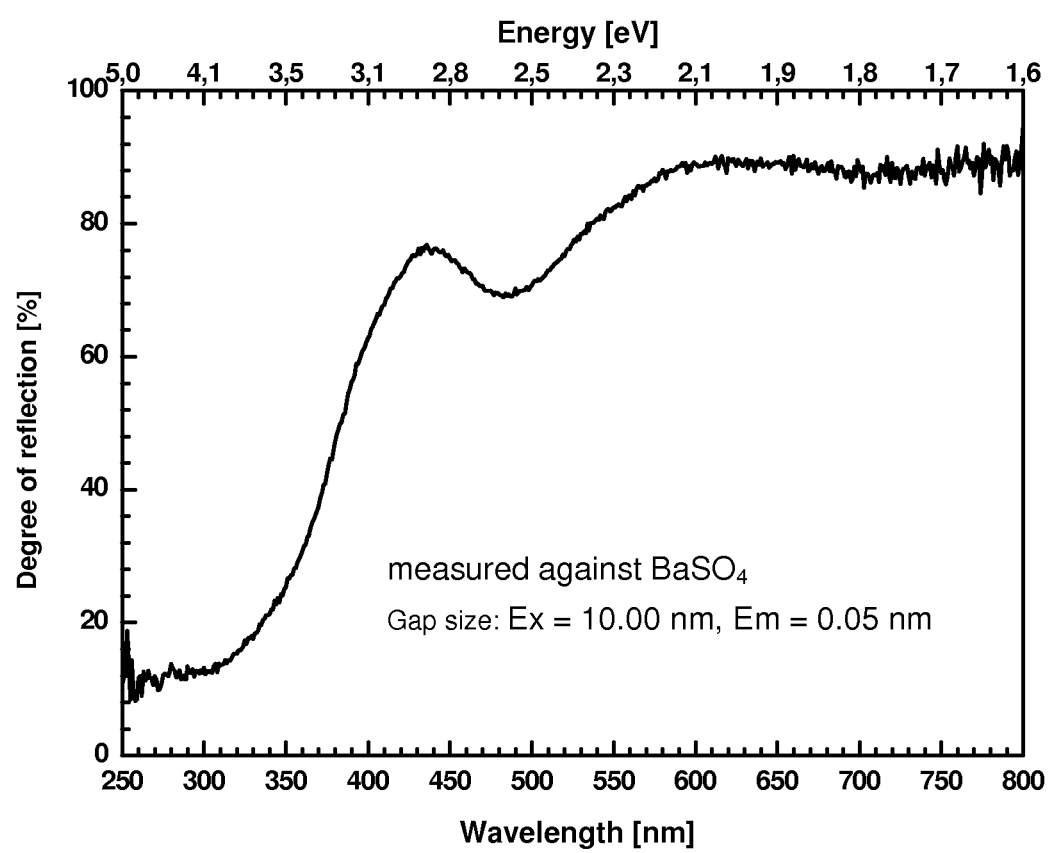
FIG. 4d: shows a reflection spectrum of $(Lu_{0.5}Gd_{0.5})_3Al_5O_{12}$:Mn(0.1%), Ca(0.1%). The spectrum was recorded on a powder layer of semi-infinite thickness with an Edinburgh Instruments FS920 spectrometer in an Ulbricht sphere using an Xe high-pressure lamp and a Hamamatsu photomultiplier at room temperature.

The invention claimed is:

1. Compound of the formula I

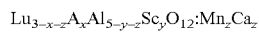

$$Lu_{3-x-z}A_xAl_{5-y-z}Sc_yO_{12}:Mn_zCa_z \qquad (I)$$

where
A stands for Y, Gd or Tb
x stands for a value from the range from 0 to 2.90
y stands for a value from the range from 0 to 0.50
z stands for a value from the range from 0.005 to 0.05.

2. Compound according to claim 1, characterised in that x stands for a value from the range from 0 to 2.0.

3. Compound according to claim 1, characterised in that y stands for a value from the range from 0.10 to 0.45.

4. Compound according to claim 2, characterised in that x stands for a value from the range from 0.10 to 0.90.

5. Compound according to claim 3, characterised in that y stands for a value from the range from 0.20 to 0.40.

6. Process for the preparation of a compound according to claim 1 comprising the following process steps:
a) mixing of lutetium-, scandium-, calcium-, aluminium-, manganese-, yttrium-, terbium- and/or gadolinium-containing materials,
b) addition of at least one further inorganic and/or organic substance, selected from the group consisting of ammonium halides, alkaline-earth metal-fluorides, alkaline-earth or alkali-metal borates, boric acid, alkaline-earth or alkali-metal carbonates, ammonium hydrogencarbonate, citric acid, alcoholates, oxalates and silicates,
c) thermal treatment of the mixture.

7. Process according to claim 6, characterised in that the alkaline-earth metal fluorides, are selected from the group consisting of calcium fluoride, strontium fluoride and barium fluoride.

8. Process according to claim 6, characterised in that the thermal treatment of the mixture is carried out in a plurality of steps.

9. Process according to claim 8, characterised in that the thermal treatment of the mixture is carried out in 2 steps.

10. Light source, characterised in that it comprises a semiconductor and at least one compound of the formula I according to claim 1.

11. Light source according to claim 10, characterised in that the semiconductor is a luminescent indium aluminium gallium nitride of the formula $In_iGa_jAl_kN$, where $0 \le i$, $0 \le j$, $0 \le k$, and $i+j+k=1$.

12. Lighting unit, characterised in that it contains at least one light source according to claim 10.

13. Lighting unit according to claim 12, characterised in that an optical coupling between the compound of formula (I) and the semiconductor is achieved by a light-conducting arrangement.

14. Display device, characterised in that it comprises at least one lighting unit according to claim 12.

* * * * *